United States Patent
Jung

(10) Patent No.: US 10,824,365 B2
(45) Date of Patent: Nov. 3, 2020

(54) MAGNETORESISTIVE MEMORY MODULE AND COMPUTING DEVICE INCLUDING THE SAME

(71) Applicants: MemRay Corporation, Seoul (KR); YONSEI UNIVERSITY, UNIVERSITY—INDUSTRY FOUNDATION (UIF), Seoul (KR)

(72) Inventor: Myoungsoo Jung, Incheon (KR)

(73) Assignees: MemRay Corporation, Seoul (KR); Yonsei University, University-Industry Foundation (UIF), Seoul (KR)

( * ) Notice: Subject to any disclaimer, the term of this patent is extended or adjusted under 35 U.S.C. 154(b) by 0 days.

(21) Appl. No.: 16/357,435

(22) Filed: Mar. 19, 2019

(65) Prior Publication Data
US 2019/0227732 A1 Jul. 25, 2019

Related U.S. Application Data

(63) Continuation of application No. PCT/KR2016/014687, filed on Dec. 15, 2016.

(30) Foreign Application Priority Data

Oct. 31, 2016 (KR) .................. 10-2016-0143591

(51) Int. Cl.
*G06F 3/06* (2006.01)
*H01L 27/22* (2006.01)
(Continued)

(52) U.S. Cl.
CPC .......... *G06F 3/0652* (2013.01); *G06F 3/0608* (2013.01); *G06F 3/0673* (2013.01);
(Continued)

(58) Field of Classification Search
CPC .... G06F 3/0608; G06F 3/0652; G06F 3/0673; G06N 20/00; H05K 2201/10166;
(Continued)

(56) References Cited

U.S. PATENT DOCUMENTS 7,275,130 B2 9/2007 Klein
2013/0311717 A1 11/2013 Kim et al.
(Continued)

OTHER PUBLICATIONS

KIPO, PCT Search Report & Written Opinion of PCT/KR2016/014687 dated Dec. 22, 2016.
(Continued)

*Primary Examiner* — Aracelis Ruiz
(74) *Attorney, Agent, or Firm* — Dinsmore & Shohl LLP

(57) ABSTRACT

A magnetoresistive memory module used as a main memory of a computing device is provided. A plurality of memory chips are mounted on a printed circuit board, and a memory controller performs data scrubbing. Each memory chip includes a plurality of magnetoresistive memory cells. Each magnetoresistive memory cell includes a magnetoresistive element and an access transistor that transfers a current to the magnetoresistive element, and has a size of a cell area that is substantially similar to a size of a DRAM cell area.

16 Claims, 17 Drawing Sheets

(51) Int. Cl.
| | |
|---|---|
| *H01F 10/32* | (2006.01) |
| *H01L 43/02* | (2006.01) |
| *G11C 11/16* | (2006.01) |
| *G06F 11/10* | (2006.01) |
| *G06N 20/00* | (2019.01) |
| *H05K 1/18* | (2006.01) |
| *H01L 43/08* | (2006.01) |
| *G11C 11/56* | (2006.01) |
| *G06F 13/16* | (2006.01) |

(52) U.S. Cl.
CPC ............ *G06F 11/106* (2013.01); *G06F 13/16* (2013.01); *G06N 20/00* (2019.01); *G11C 11/16* (2013.01); *G11C 11/161* (2013.01); *G11C 11/1675* (2013.01); *G11C 11/56* (2013.01); *H01F 10/329* (2013.01); *H01F 10/3254* (2013.01); *H01L 27/228* (2013.01); *H01L 43/02* (2013.01); *H01L 43/08* (2013.01); *H05K 1/181* (2013.01); *G11C 11/1673* (2013.01); *H05K 2201/10159* (2013.01); *H05K 2201/10166* (2013.01); *H05K 2201/10522* (2013.01)

(58) Field of Classification Search
CPC .......... H05K 2201/10159; H05K 2201/10522; G11C 16/3495
See application file for complete search history.

(56) References Cited

U.S. PATENT DOCUMENTS

| | | | |
|---|---|---|---|
| 2014/0013036 A1 | 1/2014 | Kwon et al. | |
| 2014/0332749 A1* | 11/2014 | Yokoyama | H01L 21/823431 257/4 |
| 2015/0241930 A1 | 8/2015 | Kim et al. | |
| 2015/0248329 A1 | 9/2015 | Kang et al. | |
| 2017/0139641 A1* | 5/2017 | Cha | G11C 11/40611 |

OTHER PUBLICATIONS

"NERSC computational systems", NERSC, https://www.nersc.gov/systems/computational-systems-table/.

Song Liu et al., "Flikker: Saving DRAM Refresh-power through Critical Data Partitioning", ASPLOS, Newport Beach, California, ACM, Mar. 2011.

Jamie Liu et al., "RAIDR: Retention-Aware Intelligent DRAM Refresh", ISCA, 2012.

Clinton W. Smullen et al., "Relaxing Non-Volatility for Fast and Energy-Efficient STT-RAM Caches", HPCA, 2011.

"DDR3 SDRAM", Micron Technology, Inc., 2009, https://classes.engineering.wustl.edu/cse362/images/8/8b/4Gb_DDR3_SDRAM.pdf.

M. Y. Hsiao, "A Class of Optimal Minimum Odd-weight-col. SEC-OED Codes", IBM Journal of Research and Development, vol. 14, 1970.

Hai Li et al., "Nonvolatile Memory Design: Magnetic, Resistive, and Phase Change", CRC Press, 2011.

Jing Li et al., "Design Paradigm for Robust Spin-Torque Transfer Magnetic RAM (STT MRAM) From Circuit/Architecture Perspective", IEEE Transactions on Very Large Scale Integration (VLSI) Systems, vol. 18, No. 12, Dec. 2010.

A V Khvalkovskiy et al., "Erratum: Basic principles of STT-MRAM cell operation in memory arrays", Journal of Physics D: Applied Physics, vol. 46, 2013.

Janani Mukundan et al., "MORSE: Multi-objective Reconfigurable Self-optimizing Memory Scheduler", IEEE, 2011.

Engin Ipek et al., "Self-Optimizing Memory Controllers: A Reinforcement Learning Approach", International Symposium on Computer Architecture, 2008.

Naveen Muralimanohar et al., "CACTI 6.0: A Tool to Model Large Caches", HP Laboratories, pp. 22-31, 2009.

Xiangyu Dong et al., "NVSim: A Circuit-Level Performance, Energy, and Area Model for Emerging Nonvolatile Memory", IEEE Transactions on Computer-Aided Design of Integrated Circuits and Systems, vol. 31, No. 7, Jul. 2012.

Nathan Binkert et al., "The gem5 Simulator", ACM SIGARCH Computer Architecture News, vol. 39, No. 2, May 2011.

John L. Henning, "SPEC CPU2006 benchmark descriptions", ACM SIGARCH Computer Architecture News, vol. 34, No. 4, Sep. 2006.

Zhenyu Sun et al., "Multi retention level STT-RAM cache designs with a dynamic refresh scheme", MICRO, 2011.

Helia Naeimi et al., "STTRAM scaling and retention failure", Intel Technology Journal, vol. 17, Issue 1, 2013.

Jianhua Li et al., "STT-RAM based Energy-Efficiency Hybrid Cache for CMPs", VLSI-SoC, 2011.

Yu-Ting Chen et al., "Dynamically Reconfigurable Hybrid Cache: An Energy-Efficient Last-Level Cache Design", Date, 2012.

Emre Kultursay et al., "Evaluating STT-RAM as an Energy-Efficient Main Memory Alternative", ISPASS, 2013.

* cited by examiner

FIG. 14

|     | $S_1$ | $S_2$ | $S_3$ |     | $S_n$ |
|-----|-------|-------|-------|-----|-------|
| $A_1$ | $Q_{11}$ | $Q_{12}$ | $Q_{13}$ | ... | $Q_{12}$ |
| $A_2$ | $Q_{21}$ | $Q_{22}$ | $Q_{23}$ |     | $Q_{22}$ |
| ⋮   | ⋮     |       |       |     | ⋮     |
| $A_m$ | $Q_{m1}$ | $Q_{m2}$ | $Q_{m3}$ | ... | $Q_{m2}$ |

MAGNETORESISTIVE MEMORY MODULE AND COMPUTING DEVICE INCLUDING THE SAME

CROSS-REFERENCE TO RELATED APPLICATION

This application is a continuation of PCT Application No. PCT/KR2016/014687 filed on Dec. 15, 2016, and claims priority to and the benefit of Korean Patent Application No. 10-2016-0143591 filed on Oct. 31, 2016. The entire contents of the aforementioned applications are incorporated herein by reference.

BACKGROUND (a) Field

The described technology generally relates to a magnetoresistive memory module and a computing device including the same.

(b) Description of the Related Art

Currently, a dynamic random-access memory (DRAM) is mainly used in a main memory of a computing device. However, recent data-intensive applications are demanding terabytes of working memory, forcing the DRAM to scale-down to smaller process technologies. Scaling down DRAM cells increases off-state leakage and reduces data-retention time. This results in frequent refresh operations. The power consumption increases by the frequent refresh operations, and the leakage renders the DRAM less reliable as the leakage from the off cells into bit lines can generate errors.

Replacing the DRAM with a non-volatile memory can alleviate the power and reliability issues in the long term. Among non-volatile memories, a magnetoresistive memory, in particular, a spin-transfer torque magnetoresistive random-access memory (STT-MRAM) receives considerable attention as a replacement candidate of the DRAM. However, the primary obstruction in replacing the DRAM with the magnetoresistive memory is their size difference in cell area. A typical STT-MRAM cell is five or six times larger than a DRAM cell, which renders it difficult for the STT-MRAM to attain the density required for main memory. The other issue with STT-MRAM is that its write process involves physically switching magnetic configuration of a magnetic tunnel junction (MTJ) with a large write current, which increases the energy consumption. Accordingly, despite the advantages of the magnetoresistive memory, the magnetoresistive memory has not been used as the main memory.

SUMMARY

An embodiment of the present invention provides a magnetoresistive memory module which can be used a main memory of a computing device, and the computing device including the same.

According to an embodiment of the present invention, a magnetoresistive memory module including a printed circuit board, a plurality of memory chips mounted on the printed circuit board, and a memory controller that performs data scrubbing for data stored in the plurality of memory chips is provided. Each memory chip includes a plurality of magnetoresistive memory cells. Each magnetoresistive memory cell includes a magnetoresistive element and an access transistor that transfers a current to the magnetoresistive element, and has a size of a cell area that is substantially similar to a size of a DRAM cell area.

The magnetoresistive memory cell may be a STT-MRAM cell that uses an MTJ element as the magnetoresistive element.

A size of the access transistor may be 9-12 $F^2$.

The DRAM cell may a DRAM cell applicable to a dual in-line memory module (DIMM).

The cell area in the magnetoresistive memory cell may have a size for allowing the memory chip including the plurality of magnetoresistive memory cells to be mounted on the DIMM, in place of a DRAM chip.

The magnetoresistive memory module may be used as a main memory.

The printed circuit board may further include an error correction code (ECC) chip used for the data scrubbing.

The memory controller may set a counter to an initial value for a page whenever the page is written or scrubbed, count down the counter with every cycle, decide whether the data scrubbing is required for the page when the counter hits zero, and schedule a scrub operation on the page when deciding that the data scrubbing is required.

The memory controller may set the counter to a value smaller than the initial value when deciding that the data scrubbing is not required.

The memory controller may decide whether the data scrubbing is required based on a learning model.

The learning model may include a reinforcement-learning (RL) model. In this case, an action of the RL model may be decided as either a scrub command or a command according to an input/output request, and a state of the RL model may be decided by parameters including a time elapsed since a last scrub operation and a current bit error rate (BER).

According to another embodiment of the present invention, a magnetoresistive memory module including a printed circuit board, a plurality of memory chips mounted on the printed circuit board, and a memory controller that performs data scrubbing for data stored in the plurality of memory chips is provided. Each memory chip includes a plurality of magnetoresistive memory cells. Each magnetoresistive memory cell includes a magnetoresistive element and an access transistor for transferring a current to the magnetoresistive element, and has a size of a cell area that is 9-12 F2.

The magnetoresistive memory cell may be an STT-MRAM cell that uses an MTJ element as the magnetoresistive element.

The DRAM cell may be a DRAM cell applicable to a DIMM.

The memory controller may set a counter to an initial value for a page whenever the page is written or scrubbed, count down the counter with every cycle, decide whether the data scrubbing is required for the page when the counter hits zero, and schedule a scrub operation on the page when deciding that the data scrubbing is required.

The memory controller may set the counter to a value smaller than the initial value when deciding that the data scrubbing is not required.

The memory controller may decide whether the data scrubbing is required based on a learning model.

The learning model may include an RL model. In this case, an action of the RL model may be decided as either a scrub command or a command according to an input/output request, and a state of the RL model may be decided by parameters including a time elapsed since a last scrub operation and a current BER.

According to yet another embodiment of the present invention, a computing device including the above-described magnetoresistive memory module, a CPU that uses the magnetoresistive memory module as a main memory, and a system bus that connects the magnetoresistive memory module and the CPU is provided.

According to an embodiment of the present invention, a magnetoresistive memory module can be used as a main memory of a computing device.

BRIEF DESCRIPTION OF THE DRAWINGS

FIG. 14 is a drawing showing a state-action pair table in a reinforcement-learning model shown in FIG. 13.

DETAILED DESCRIPTION OF THE EMBODIMENTS

Figure 1:
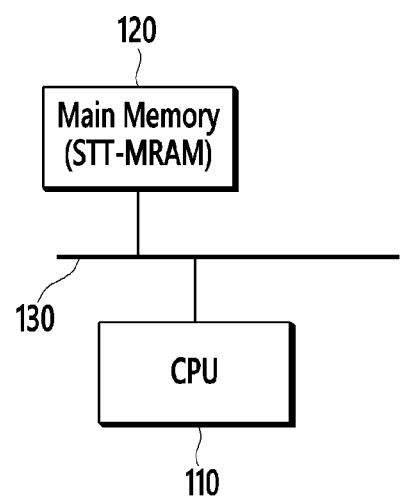
FIG. 1 is a schematic block diagram of a computing device according to an embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 is a schematic block diagram of a computing device according to an embodiment of the present invention. FIG. 1 shows one example of the computing device, and the computing device according to an embodiment of the present invention may be implemented by various structures.

Referring to FIG. 1, a computing device according to an embodiment of the present invention includes a central processing unit (CPU) 110, a main memory 120, and a system bus connecting the CPU 110 and the main memory 120.

In some embodiments, the computing device may be any one of various types of computing devices. The various types of computing devices may include a mobile phone such as a smart phone, a tablet computer, a laptop computer, a desktop computer, a multimedia player, a game console, a television, various types of internet of things (IoT) devices, and the like.

The main memory 120 may use a magnetoresistive memory, i.e., a magnetoresistive random-access memory (MRAM) instead of a dynamic random access memory (DRAM) used by a typical computing device. In some embodiments, the main memory 120 may use a spin-transfer torque (STT) MRAM (STT-MRAM) among the MRAMs. Hereinafter, it is described that the STT-MRAM is used as the main memory 120.

Next, an STT-MRAM used as a main memory according to an embodiment of the present invention is described.

Figure 2:
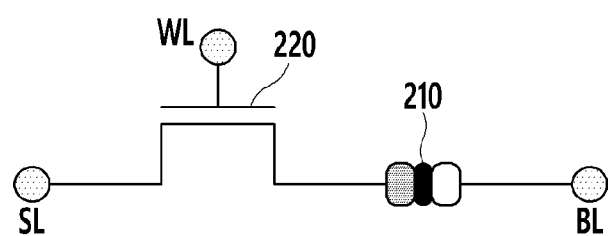
FIG. 2 is a drawing schematically showing a structure of an STT-MRAM cell.
Figure 3:
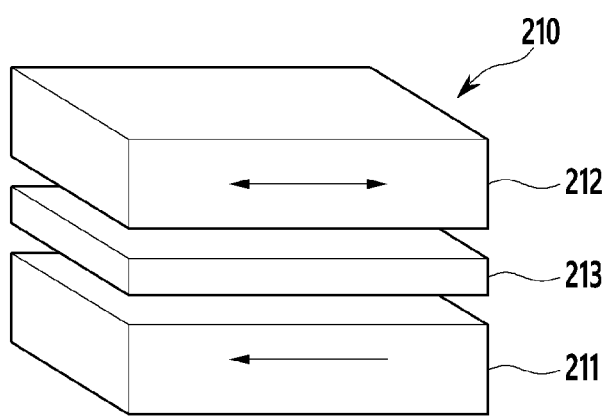
FIG. 3 is a drawing schematically showing a structure of an MTJ element in an STT-MRAM cell.
Figure 4:
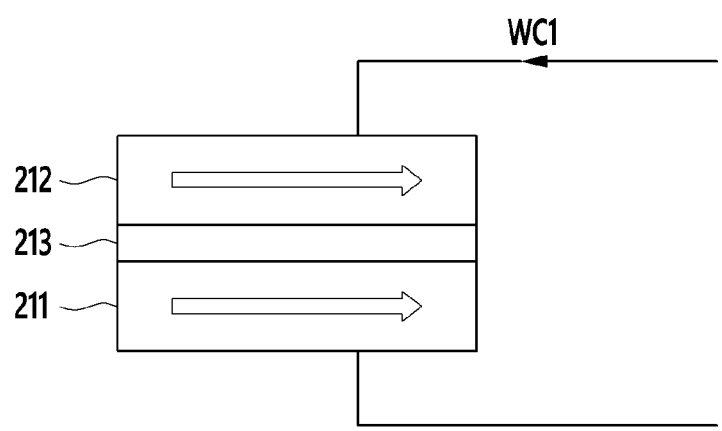
FIG. 4 and FIG. 5 are drawings showing a magnetization direction of an MTJ element.
Figure 5:
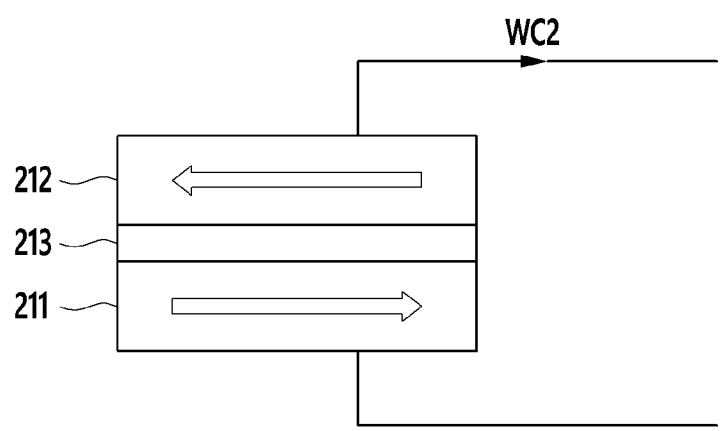

FIG. 2 is a drawing schematically showing a structure of an STT-MRAM cell, FIG. 3 is a drawing schematically showing a structure of an MTJ element in an STT-MRAM cell, and FIG. 4 and FIG. 5 are drawings showing a magnetization direction of an MTJ element.

Referring to FIG. 2, an STT-MRAM cell includes a magnetic tunnel junction (MTJ) element 210 as a magnetoresistive element, and further includes an access transistor 220 connected to the MTJ element 210.

The MTJ element 210 works a storage element, and the access transistor 220 is used to activate and control the MTJ element 210. The access transistor 220 has an input terminal, an output terminal, and a control terminal. For example, when the access transistor 220 is an N-channel metal oxide semiconductor (NMOS) transistor, the input terminal, the output terminal, and the control terminal may be a source, a drain, and a gate, respectively.

In the access transistor 220, the input terminal is connected to a source line SL and the control terminal is connected to a word line WL. The MTJ element 210 is connected between the output terminal of the access transistor 220 and a bit line BL.

Referring to FIG. 3, the MTJ element 210 includes a fixed layer 211 having a predetermined fixed magnetization direction, a free layer 212 magnetized in a direction of an externally applied magnetic field, and a tunnel barrier layer 213 formed between the fixed layer 211 and the free layer 212. For example, the tunnel barrier layer 213 may be formed by magnesium oxide (MgO).

For a write operation of the STT-MRAM cell, a voltage, for example, a high-level voltage may be applied to the word line WL to turn on the access transistor 220, and a write current may be applied between the bit line BL and the source line SL.

The magnetization direction of the free layer 212 may be determined by the write current WC1 or WC2 flowing through the MTJ element 210. For example, when a first write current WC1 flows through the MTJ element 210, free electrons having the same spin direction as the fixed layer 211 apply torque to the free layer 212. As a result, the free layer 212 can be magnetized parallel to the fixed layer 211. When a second write current WC2 having an opposite direction from the first write current WC1 flows through the MTJ element 210, electrons having an opposite spin direction to the fixed layer 211 return to the free layer 212 and apply torque. As a result, the free layer 212 can be magnetized anti-parallel to the fixed layer 211. Thus, in the MTJ element 210, the magnetization direction of the free layer 212 may be changed due to spin transfer torque.

For a read operation of the STT-MRAM cell, a voltage, for example, a high-level voltage may be applied to the word line WL to turn on the access transistor 220, and a read current may be applied from the bit line BL toward the source line SL so that data stored in the STT-MRAM cell can be read according to the resistance of the MTJ element 210 due to the read current. Since the read current has a much lower intensity than the write current, the magnetization direction of the free layer 212 does not change by the read current.

The resistance of the MTJ element 210 may change according to the magnetization direction of the free layer 212. As shown in FIG. 4, when the magnetization direction of the free layer 212 is parallel to the magnetization direction of the fixed layer 211 in the MTJ element 210, the MTJ element 210 has a low resistance. This parallel state of the MTJ element 210 may be set to a state of storing data '0'. As shown in FIG. 5, when the magnetization direction of the free layer 212 is anti-parallel to the magnetization direction of the fixed layer 211 in the MTJ element 210, the MTJ element 210 has a high resistance. This anti-parallel state of the MTJ element 210 may be set to a state of storing data '1'. Accordingly, the state of the STT-MRAM cell can be read based on a voltage of the MTJ element 210 when the read current is applied to the MTJ element 210. The data '0' can be read when the voltage of the MTJ element 210 is low, and the data '1' can be read when the voltage of the MTJ element 210 is high.

Alternatively, the MTJ element 210 having the low resistance may be set to the state of storing the data '1', and the MTJ element 210 having the high resistance may be set to the state of storing the data '0'.

In the STT-MRAM cell, since it is sufficient to measure the resistance of the cell for the read operation, a small current is required. However, for the write operation, a large current is required to change the magnetization direction of the free layer 212 in the MTJ element 210. Specifically, to avoid a write failure, the access transistor with a large channel width-to-length ratio (W/L ratio) is used to drive the write current, which in turn increases the size of the STT-MRAM cell.

Next, a method of designing a size of an STT-MRAM cell area in an STT-MRAM module according to an embodiment of the present invention is described.

Figure 6:
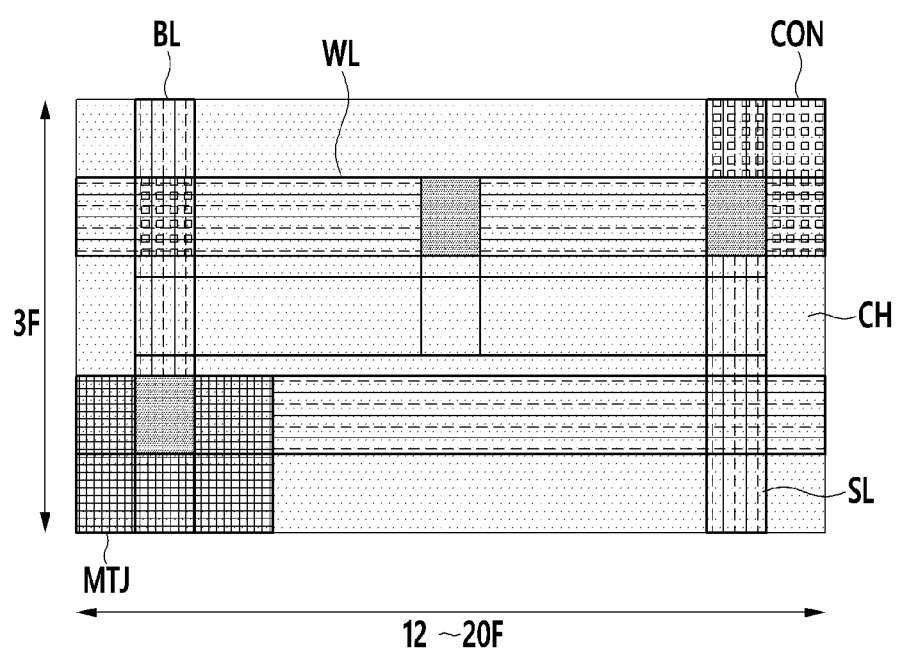
FIG. 6 is a drawing showing a conventional STT-MRAM cell area.
Figure 7:
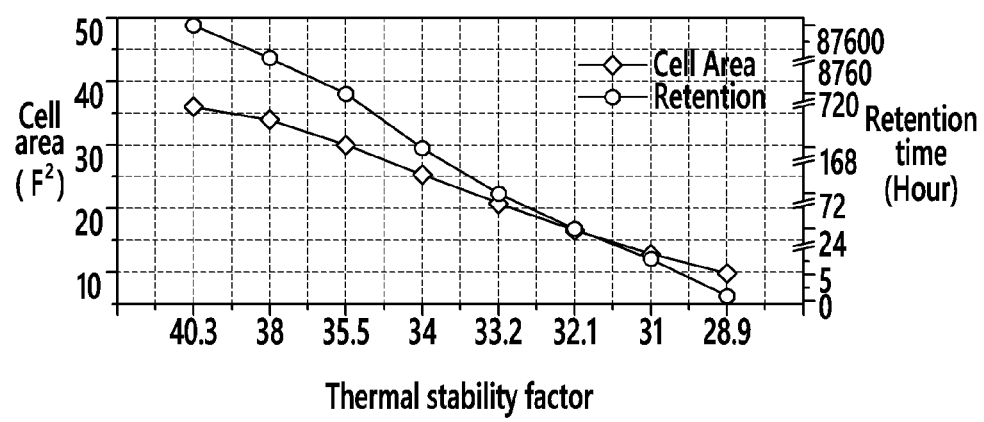
FIG. 7 is a graph showing sizes of STT-MRAM cells and retention times according to thermal stability factors.
Figure 8:
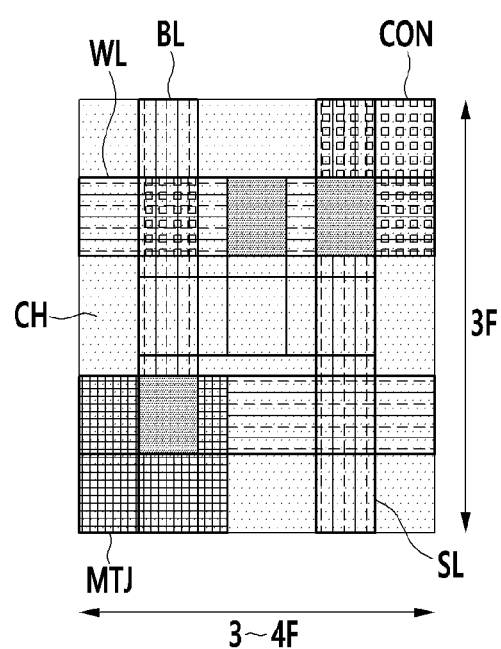
FIG. 8 is a drawing showing an STT-MRAM cell area according to an embodiment of the present invention.
Figure 9:
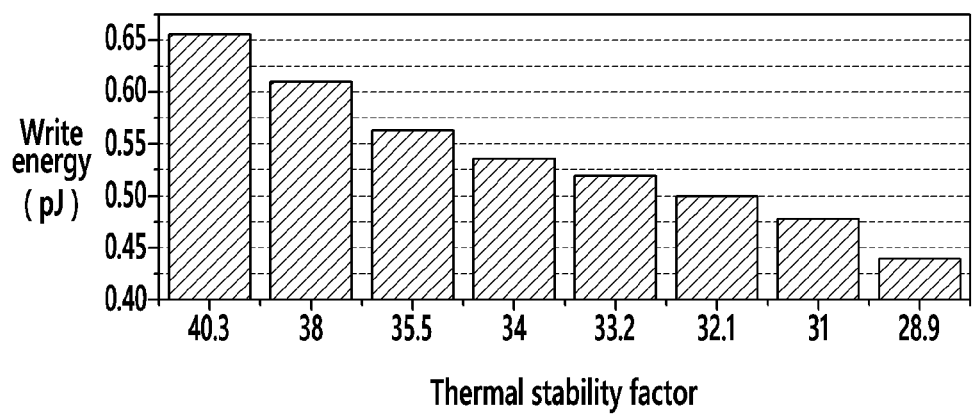
FIG. 9 is a graph showing write energies according to thermal stability factors

FIG. 6 is a drawing showing a conventional STT-MRAM cell area, FIG. 7 is a graph showing sizes of STT-MRAM cells and retention times according to thermal stability factors, FIG. 8 is a drawing showing an STT-MRAM cell area according to an embodiment of the present invention, and FIG. 9 is a graph showing write energies according to thermal stability factors.

Referring to FIG. 6, for a large write current, an STT-MRAM cell is fabricated such that a channel area CH of an access transistor substantially covers a cell area. Accordingly, a size of the STT-MRAM cell area is determined by a size of the access transistor, i.e., an area of the channel area CH regardless of an MTJ element, a bit line BL, a word line WL, a source line SL, and a connection CON of the access transistor, and is substantially the same as a size of the access transistor. As shown in FIG. 6, the size of the conventional STT-MRAM cell area, i.e., the access transistor has 12~20 F in a row direction and 3 F in a column direction, i.e., approximately 36~60 $F^2$. Here, F denotes a feature size. The STT-MRAM cell having such the size is larger than the DRAM cell so that the STT-MRAM cell cannot substitute the main memory occupied by the DRAM.

Hereinafter, a design condition of an STT-MRAM cell in an STT-MRAM module according to an embodiment of the present invention is described.

In order to ensure data storage reliability, an MTJ element in an STT-MRAM cell must maintain parallel and anti-parallel states in a stable manner. A thermal stability factor Δ refers to a stability of a magnetic orientation of the MTJ element, and may be modeled as Equation 1.

$$\Delta \propto E_b \approx \frac{H_K M_S V}{2 k_B T} \qquad \text{Equation 1}$$

Here, $E_b$ is an energy barrier, T is a temperature, $H_K$ is an anisotropic field, $M_S$ is a saturation magnetization, $k_B$ is a Boltzmann constant, and V is a volume of the MTJ element.

Because the parameters other than the MTJ element in Equation 1 are fixed, the thermal stability factor Δ can be set by changing the volume of the MTJ element.

A critical current refers to a minimum current that switches a polarity of a free layer in the MTJ element. The critical current $I_C$ may be modeled as Equation 2. It can be noted from Equation 2 that the critical current $I_C$ can be reduced by reducing the thermal stability factor Δ.

$$I_C = \gamma[\Delta + \delta VT] \qquad \text{Equation 2}$$

Here, γ and δ are fitting constants that represent an operational environment.

A retention time of the MTJ element is an expected time before a random bit-flip occurs. The retention time $I_{Retention}$ depends on the thermal stability factor Δ, and may be expressed as Equation 3.

$$T_{Retention} = \frac{1}{f_0} \exp(\Delta) \qquad \text{Equation 3}$$

Here, $f_0$ is an operating frequency.

It can be noted from Equations 2 and 3 that, while a low thermal stability factor reduces the critical current requirement of the MTJ element, it also shortens the retention time.

As described above, the STT-MRAM cell includes an MTJ element and an access transistor, and the MTJ element has comparatively a small size. Therefore, a size of the access transistor is a main factor of an STT-MRAM cell area. As the access transistor is used to control a current to go through the MTJ element, the size of the access transistor may be decided by a maximum current used in the STT-MRAM cell. Thus, the STT-MRAM cell area can be minimized by reducing the critical current.

Optimized cell areas under the reduced thermal stability factors are measured based on Equations 1 to 3, and the results are shown in FIG. 7. It can be noted from FIG. 7 that the cell area keeps decreasing as the thermal stability factor decreases, and lowering of thermal stability factor also shortens the retention time.

According to an embodiment of the present invention, the size of the STT-MRAM cell area is reduced to be substantially similar to the size of the DRAM cell area. In some embodiments, "substantially similar" may mean the size of the STT-MRAM cell area for capable of mounting a memory chip including a plurality of STT-MRAM cells in a commercial main memory module in place of a DRAM chip.

In one embodiment, by considering the trade-off between the cell area size and the retention time, the thermal stability factor may be shortened from approximately 40.3 to approximately 28.9, and the cell area size, i.e., the size of the access transistor may be reduced from approximately 36 $F^2$ to approximately 10 $F^2$ (i.e., 9~12 $F^2$). Since the reduced cell area of the STT-MRAM cell is substantially similar to the cell area of the DRAM cell, a memory chip including STT-MRAM cells can be applicable to a commercial main memory module. Further, since the write current is reduced by shortening the thermal stability factor, the write energy can decrease from approximately 0.656 pJ to approximately 0.44 pJ as shown in FIG. 9.

On the other hand, shortening the thermal stability factor reduces the retention time so that data reliability may be deteriorated. Accordingly, in some embodiments, data scrubbing may be applied to the STT-MRAM module.

Next, an STT-MRAM module according to an embodiment of the present invention is described.

Figure 10:
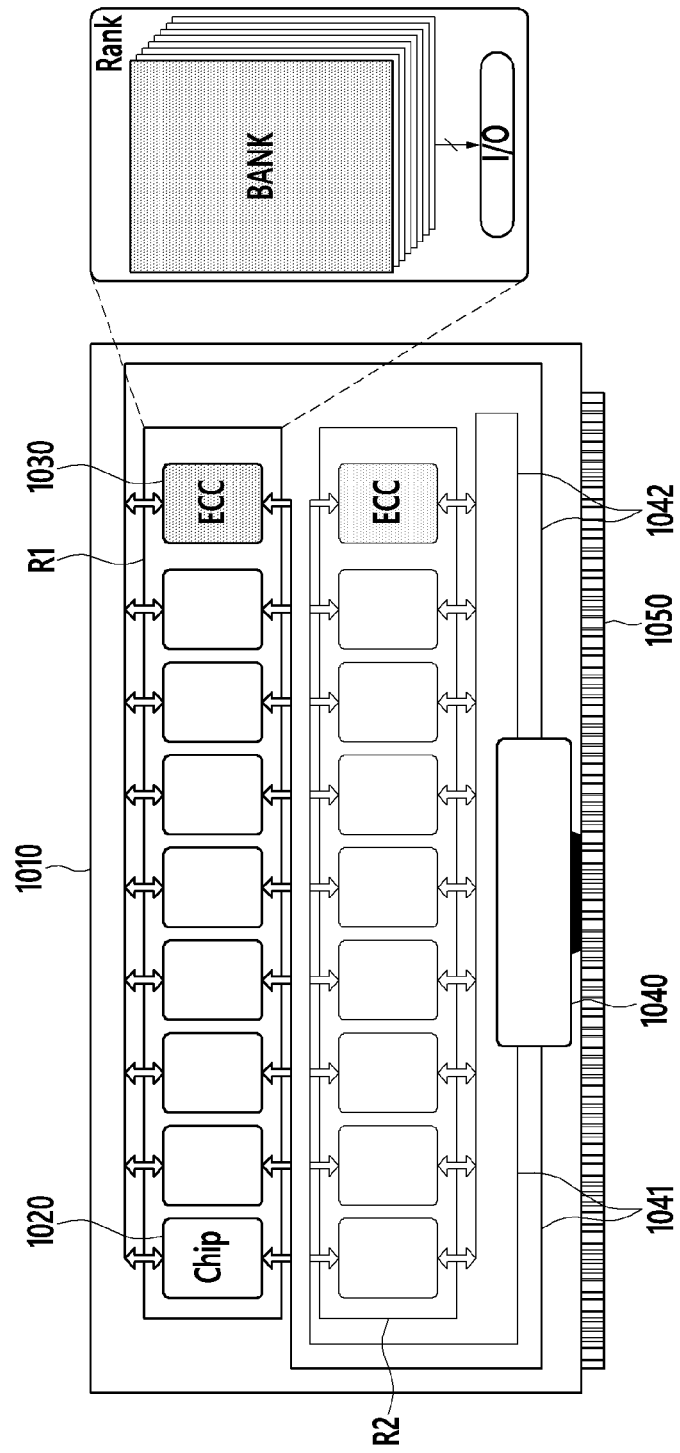
FIG. 10 is a schematic drawing showing an STT-MRAM module according to an embodiment of the present invention.
Figure 11:
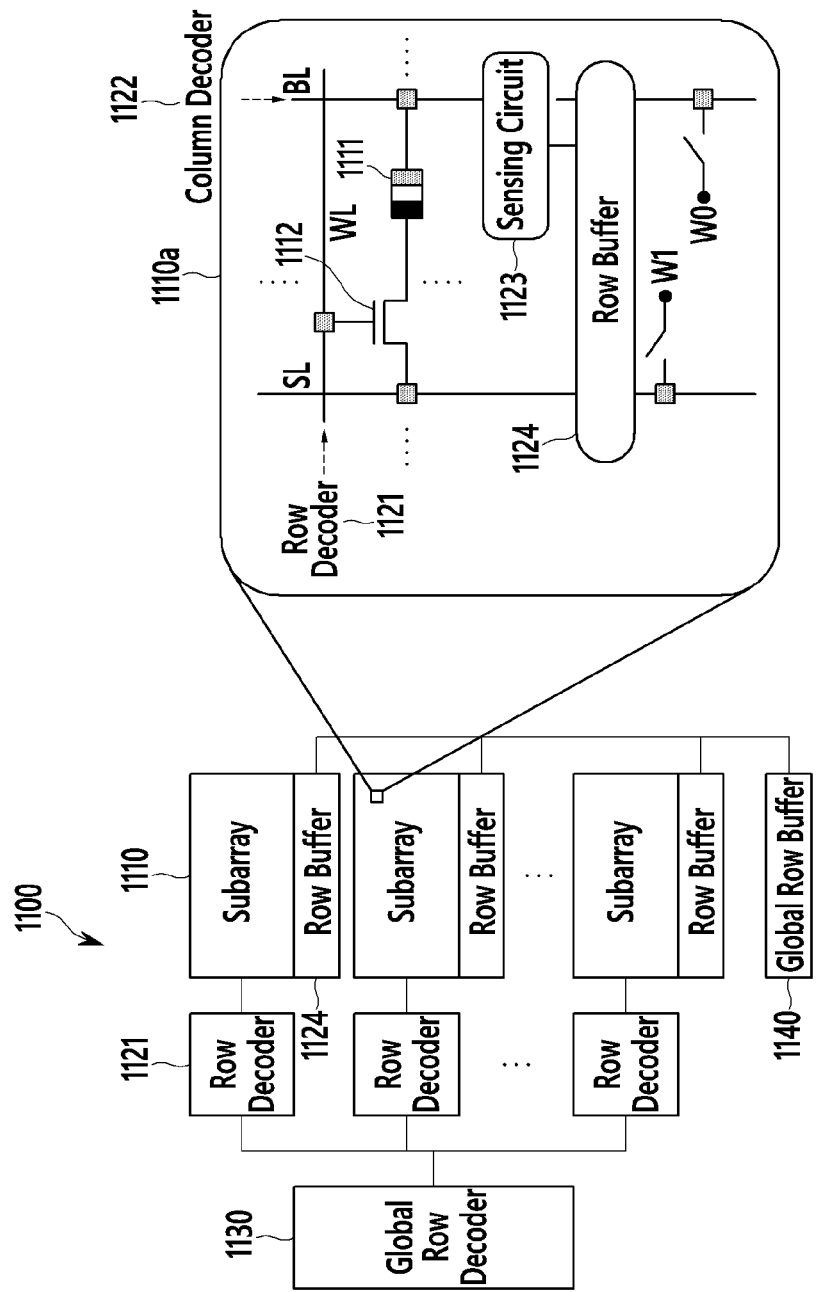
FIG. 11 is a schematic drawing showing a subarray of an STT-MRAM module shown in FIG. 10.

FIG. 10 is a schematic drawing showing an STT-MRAM module according to an embodiment of the present invention, and FIG. 11 is a schematic drawing showing a subarray of an STT-MRAM module shown in FIG. 10.

It is assumed in FIG. 10 and FIG. 11 that an STT-MRAM module is employed in a commercial dual in-line memory module (DIMM). For example, the DIMM may be a DIMM having a DDR3 PC3-12800 interface.

Referring to FIG. 10, an STT-MRAM module 1000 include a printed circuit board 1010, a plurality of memory chips 1020, an error correction code (ECC) chip 1030, a memory controller, 1040 and a connector 1050.

In some embodiments, the STT-MRAM module employed in the DIMM may include two ranks R1 and R2. One rank R1 may be formed on a front surface of the printed circuit board 1010, and the other rank R2 may be formed on a back surface of the printed circuit board 1010. While the two ranks R1 and R2 are shown together in FIG. 10 for convenience, the rank R2 may be actually formed on a back surface of the printed circuit board 1010.

Each rank may include a plurality of memory chips (e.g., eight memory chips) 1020 and ECC chips 1030. The memory chip 1020 and ECC chip 1030 of the rank R1 may be coupled to the front surface of the printed circuit board 1010, and the memory chip 1020 and ECC chip 1030 of the rank R2 may be coupled to the back surface of the printed circuit board 1010.

The memory controller 1040 is connected to the memory chips 1020 and the ECC chips 1030 via buses. The buses may include an address bus 1041 for transferring an address and a command, and a data bus 1042 for transferring data. The memory controller 1040 performs data scrubbing on STT-MRAM cells of the memory chips 1020 using the ECC chips 1030. In one embodiment, the memory controller 1040 may include a scrub scheduler for scheduling the data scrubbing.

The connecter 1050 may connect the STT-MRAM module to a slot for a main memory of the computing device.

According to an embodiment of the present invention, the above-described structure can provide the STT-MRAM module that fits in existing main memory infrastructure.

Each rank may be logically divided into a plurality of banks (e.g., eight banks) 1050. The plurality of banks may be connected to the data bus 1042 via a data input/output unit (I/O).

Referring to FIG. 11, each bank 1100 includes a plurality of subarrays 1110. The subarray 1110 includes a plurality of bit lines BL, a plurality of source lines SL, a plurality of word lines WL, and a plurality of MTJ elements 1111. In some embodiments, the bit lines BL and the source lines SL may be extended substantially in a column direction, and the word lines WL may be extended substantially in a row direction. In this case, the MTJ element 1111 may be connected to a corresponding bit line BL, source line SL, and word line WL through an access transistor 1112, thereby forming an STT-MRAM cell 1110a. Further, the word lines WL may define a row of the subarray, and a pair of the bit line BL and source line SL may define a column of the subarray. For convenience, only one STT-MRAM cell 1110a is shown in FIG. 11.

Each subarray is connected to a row decoder 1121, a column decoder 1122, a sensing circuit 1123, a row buffer 1124, and write drivers W0 and W1. The row decoder 1121 decodes a row address to select a target word line WL, i.e., a target row to be activated in the subarray. The column decoder 1122 decodes a column address to select a target bit line BL, i.e., a target column to be activated in the subarray. The sensing circuit 1123 is connected to the plurality of bit lines BL, and reads data of the STT-MRAM cell 1110a connected to the activated word line WL through the bit line BL. The row buffer 1124 stores the data read by the sensing circuit 1123. The write drivers W0 and W1 are connected to the plurality of bit lines BL and/or the plurality of source lines SL, and write data to the STT-MRAM cell 1110a connected to the activated word line WL. In one embodiment, the write drivers W0 and W1 may include a write driver W0 for writing data of '0' and a write driver W1 for writing data of '1'. In this case, one write driver W0 may be connected to the bit lines BL, and the other write driver W1 may be connected to the source lines SL.

In some embodiments, read/write of data may be performed in pages. For this, a plurality of bit lines BL are activated by the column decoder 1122 so that the sensing circuit 1123 can read data in pages or the write drivers W0 and W1 can write in pages. A size of the page may be, for example, 4 KB.

The bank may further include a global row decoder 1130 and a global row buffer 1140. The global row decoder 1130 may select any one among the plurality of row decoders 1121 connected to the plurality of subarrays 1110 respectively. The global row buffer 1140 may store data stored in the plurality of row buffers 1124 connected to the plurality of subarrays 1110 respectively.

In some embodiments, the STT-MRAM module may follow a DDR (double data rate) standard for a read/write operation. That is, for the read/write operation, the STT-MRAM module may perform an operation of decoding a row address to activate a target word line, an operation of decoding a column address to activate a specific bit line, and an operation of driving the sensing circuit or write driver to read or write data.

Next, data scrubbing in an STT-MRAM module according to an embodiment of the present invention is described.

According to some embodiment, a memory controller of an STT-MRAM module may perform data scrubbing at constant intervals. In this case, the constant interval may be a much longer interval than refresh which is typically performed in a DRAM module, for example, an interval of several hours. Referring to the graph of FIG. 7, the constant interval may be set to approximately one hour.

Performing the data scrubbing at constant intervals may increase energy consumption due to a high scrub frequency. Hereinafter, a scrub scheduler capable of providing data scrubbing that can minimize the scrub frequency and does not rely on a fixed period is described.

Figure 12:
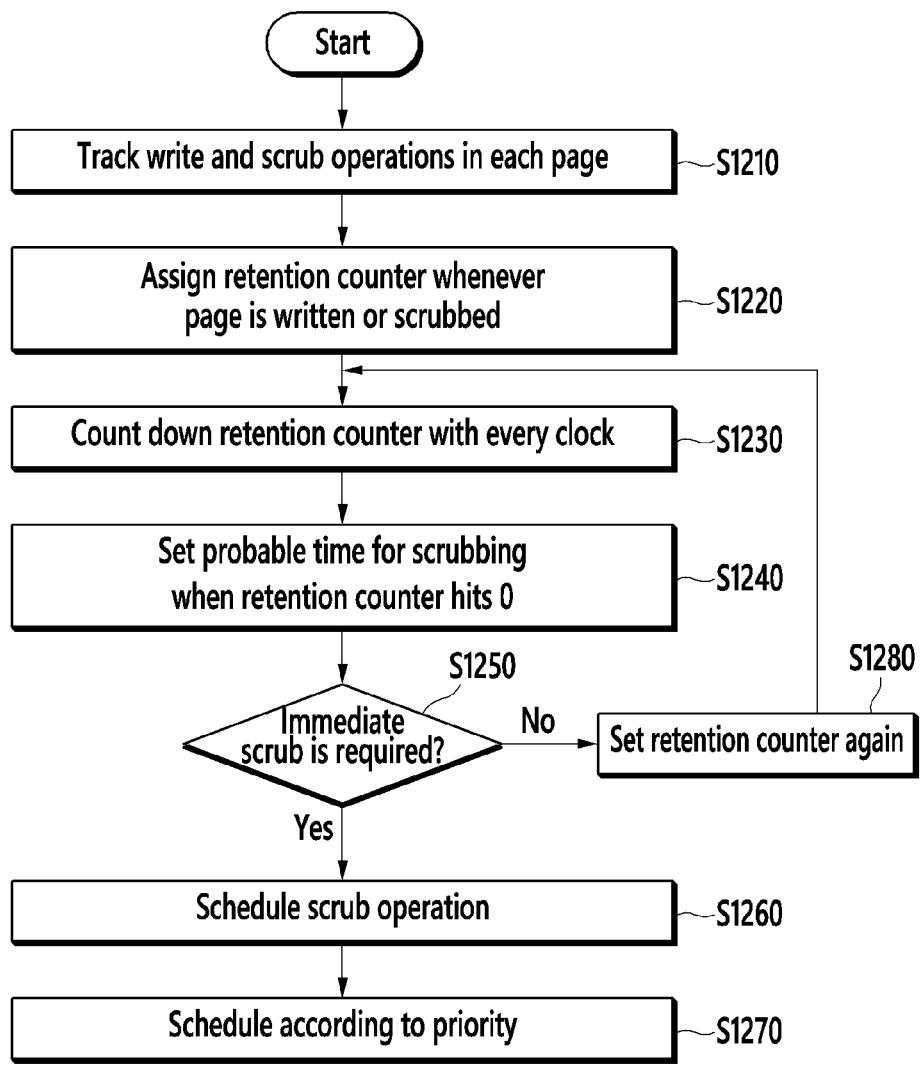
FIG. 12 is a flowchart of showing a data scrubbing method of an STT-MRAM module according to an embodiment of the present invention.

FIG. 12 is a flowchart of showing a data scrubbing method of an STT-MRAM module according to an embodiment of the present invention.

Referring to FIG. 12, a scrub scheduler tracks a write operation and scrub operation in each page on an STT-MRAM module (S1210). Whenever a page is written or scrubbed, the scrub scheduler sets a retention counter assigned to the corresponding page to an initial value (S1220) and counts down the retention counter with every clock cycle (S1230). When the retention counter hits zero, the scrub scheduler decides that it is a probable time for scrubbing the corresponding page (S1240). Accordingly, the scrub scheduler decides whether an immediate scrub operation is required in order to maintain reliable data retention for the corresponding page (S1250). In some embodiment, the scrub scheduler may decide whether the immediate scrub operation is required based on a learning model.

Upon deciding that the immediate scrub operation is required (S1250), the scrub scheduler schedules a scrub operation (S1260). Accordingly, a memory controller performs the scrub operation on a page with a higher priority (S1270). In some embodiments, the scrub scheduler appends the corresponding page to a list of pages to be scrubbed, using a scrub sequence number. In one embodiment, the scrub scheduler may append the corresponding page to the list of pages to be scrubbed in the corresponding bank. The scrub scheduler may use a bank identifier (ID) to identify the bank. In one embodiment, the scrub scheduler may set a scrub-required flag for the corresponding page. In some embodiments, the scrub sequence number may be assigned based on a FIFO (first in, first out) model. In one embodiment, a lower sequence number may indicate a higher priority for scrubbing. The scrub sequence number may be updated every time a page is scrubbed or written in the bank.

Upon deciding that scrubbing is not required immediately (S1250), the scrub scheduler sets the retention counter again (S1280), and counts down the retention counter again (S1230). In this case, the scrub scheduler may set the retention counter to a smaller value. For example, the scrub scheduler may set the retention counter to one-third of the previous value again. As such, decreasing the setting value of the retention counter allows the scrub scheduler to check on a page more closely. The process (S1280) of setting the retention counter again is repeated until the page is overwritten or scrubbed. When the page is overwritten or scrubbed, the retention counter is reset to its original value (S1220).

Next, an example of a learning model used in a scrub scheduler according to an embodiment of the present invention is described.

Figure 13:
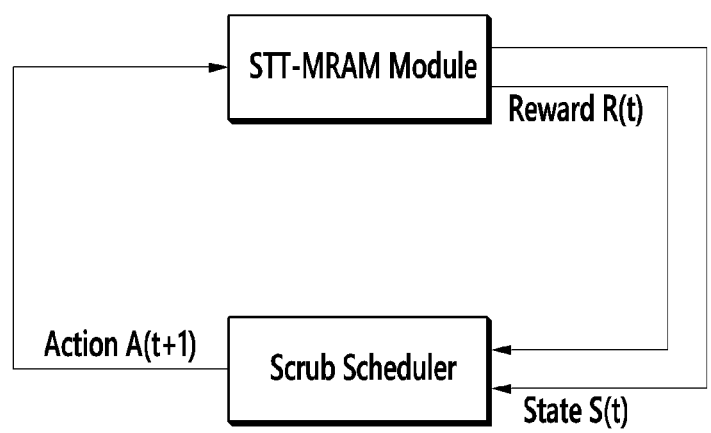
FIG. 13 is a drawing explaining a reinforcement-learning model of a scrub scheduler according to an embodiment of the present invention.

FIG. 13 is a drawing explaining a reinforcement-learning (RL) model of a scrub scheduler according to an embodiment of the present invention, and FIG. 14 is a drawing showing a state-action pair table in an RL model shown in FIG. 13.

Referring to FIG. 13, an RL model for a scrub scheduler uses a state, an action, and a reward.

A state function may decide a state S(t) using a time elapsed since the last scrub operation and a current bit error rate (BER). In some embodiments, the state function may further use a scrub frequency at deciding the state S(t). An action function selects any one action A(t+1) in two actions, and the two actions include a scrub action and an action of assigning a scheduled I/O command. A reward R(t) is a reward received when the action A(t) is executed at the current state S(t) in an STT-MRAM module, and includes an immediate reward and a long-term reward. An immediate reward goal is to maintain a BER permitted by an ECC scheme of an ECC chip, and a long-term reward goal is to minimize the scrub frequency and maximize I/O operations.

A Q-value of a state-action pair (S, A) represents an expected value of a cumulative reward that is obtained when the action A is executed in the state S. The Q-value may represent a long-term value for scheduling commands at a given state. If the Q-values are learned and recorded according to a scheduling policy for each of state-action pairs, the scrub scheduler may simply select the action with the highest Q-value to maximize the long-term reward. As shown in FIG. 14, the Q-values for the state-action pairs may be managed in a table form and be updated continuously. Referring to FIG. 14, Q-values $Q_{11}$-$Q_{mn}$ for pairs defined by n states $S_1$-$S_n$ and m actions $A_1$-$A_m$ are managed in the table form.

Next, a scheduling policy of a scrub scheduler is described with reference to below algorithm 1.

As described above, a scrub scheduler may manage a table that records Q-values for all possible state-action pairs. Initially, the scrub scheduler performs initialization (lines 1-4). At the initialization stage, the scrub scheduler initializes all entries of the table (line 2). In one embodiment, the scrub scheduler may initialize all entries with the highest possible Q-value. For example, the Q-values may be set to $(1/(1-\gamma))$. Here, $\gamma$ is a discount rate parameter, which determines how important future rewards are compared to immediate rewards. Further, the scrub scheduler initializes action A with a command that is randomly issued between a scrub command and a command (i.e., a read command or a write command) from an scheduled I/O operation in a transaction queue (line 3), and sets a Q-value $Q_P$ by obtaining the Q-value for a current state-action (S, A) pair from the table (line 4).

The scrub scheduler performs next operations (lines 5-14) every test signal. For example, the test signal may occur when the scrub scheduler determines that it is a probable time for scrubbing at step S1240 of FIG. 12. The scrub scheduler issues a command A selected during the previous cycle (line 6), and collects the immediate reward R for the issued command (line 7).

On the other hand, an assumption that the scrub scheduler has a non-zero probability of visiting each table entry is needed for the RL model. If the scrub scheduler never chooses certain actions in a given state, it would be unable to learn the associated Q-values. Further, even if the scrub scheduler has already learned an optimal policy, changes in the dynamic behavior of the environment may render the already-learned policy obsolete. The scrub scheduler may use an exploration mechanism for random actions besides the learned optimal actions. That is, the scrub scheduler may decide a random command as a next action with a certain probability and decide a command with the highest Q-value as the next action in other cases. In some embodiments, the scrub scheduler may use an exploration parameter $\varepsilon$ for this probability. That is, if a value rand( ) that is randomly generated is less than the exploration parameter $\varepsilon$, the scrub scheduler may randomly select either the scrub command or the command from the scheduled I/O operation and decide the selected command as the next action (exploration) (lines 8-9). As such, the scrub scheduler can explore the environment and adapt the policy to the dynamic changes by issuing the random command. If the randomly generated value rand( ) is equal to or greater than the exploration parameter $\varepsilon$, the scrub scheduler may decide the command with the highest Q-value in the current state as the next action (exploitation) (lines 10-11). In one embodiment, a very small value may be assigned to the exploration parameter ε so as to ensure that the commands with the highest Q-value are mostly selected.

Next, the scrub schedule estimates a new Q-value $Q_{Sel}$ by obtaining the Q-value for the current state-action pair (i.e., the action decided in lines 8-11 at the current state) from the table (line 12). The scrub scheduler updates the estimated Q-value $Q_{Sel}$ based on the previous Q-value $Q_P$, the reward R, and the estimated Q-value $Q_{Sel}$ (line 13). In some embodiments, the scrub scheduler may use a SARSA update for updating the Q-value. According to the SARSA update, the Q-value $Q_{Sel}$ may be updated by below equation 4. The scrub scheduler sets the updated Q-value $Q_{Sel}$ as a Q-value $Q_P$ for a next cycle (line 14).

$$Q_{Sel} \leftarrow (1-\alpha)Q_P + \alpha(R + \gamma Q_{Sel}) \quad \text{Equation 4}$$

Here, α is a learning rate parameter.

As such, the scrub scheduler can learn the Q-value and then decide the action with the highest Q-value. Accordingly, the scrub scheduler can efficiently decide whether the immediate scrub operation is required.

---

Algorithm 1

Algorithm: iScrub scheduling algorithm
Data: A: Action (i.e., Command), S: State, R: Reward
Input: γ: Discount parameter, ε: Exploration parameter
 1  Initialization
 2  All Q-values ← 1/ (1−y)
 3  A ← select randomly: command from transaction queue or, scrub
 4  $Q_P$ ← get Q-value for current S and A
 5  for Every "test" signal do
 6      Issue A, selected during the previous cycle
 7      Collect immediate R for the issued command
 8      if rand( ) < ε then
 9          Next A ← random command
10      else
11          Next A ← command with the highest Q-value
12      $Q_{Sel}$ ← Q-value for the current S and A
13      Update_Q ← SARSA update based on $Q_P$, R, $Q_{Sel}$
14      $Q_P$ ← $Q_{Sel}$ // Set Q-value for next cycle

---

According to an embodiment described above, since the data scrubbing can be performed by scheduling of the scrub scheduler, the data reliability can be improved in the STT-MRAM module used as the main memory.

In one embodiment, the data scrubbing may mean data scrubbing used in a non-volatile memory. In another embodiment, the data scrubbing may mean a refresh operation used in a volatile memory. In this case, the scrubbing (refresh) may be performing with a much longer interval compared to the refresh of the volatile memory.

Next, results measured after implementing an STT-MRAM module according to an embodiment of the present invention on a real hardware are described.

To measure the performance of the STT-MRAM module, evaluation of the following four memory configurations is performed, and simulation parameters shown in Table 1 are used in the evaluation.

(1) DDR3 DRAM: This memory configuration represents a case where a conventional DRAM memory with periodic refresh operations is used as a main memory.

(2) STT-MRAM1: This memory configuration represents a case where a conventional STT-MRAM of ten year retention time is used as a main memory.

(3) STT-MRAM2: This memory configuration represents a case where an STT-MRAM module which does not use a scrub scheduler among embodiments of the present invention is used as a main memory.

(4) STT-MRAM3: This memory configuration represents a case where an STT-MRAM module which uses a scrub scheduler among embodiments of the present invention is used as a main memory.

TABLE 1

| | |
|---|---|
| Processor | 2.8 GHz, OoO execution, SE mode |
| L1 Cache | Private 64 KB Instruction and 64 KB Data Cache |
| L2 Cache | Shared 8 MB Unified Cache |
| Working Memory (Refresh freq.) | DRAM (64 ms), STT-MRAM1 (non-volatile), STT-MRAM2 (1 hour), STT-MRAM3 (varying) |
| Row Buffer Strategy | FR-FCFS and Open adaptive |
| Workloads | perl, bzip2, gcc, bwaves, cactus, gobmk, calc, hmmer, lib and lbm |

Figure 15:
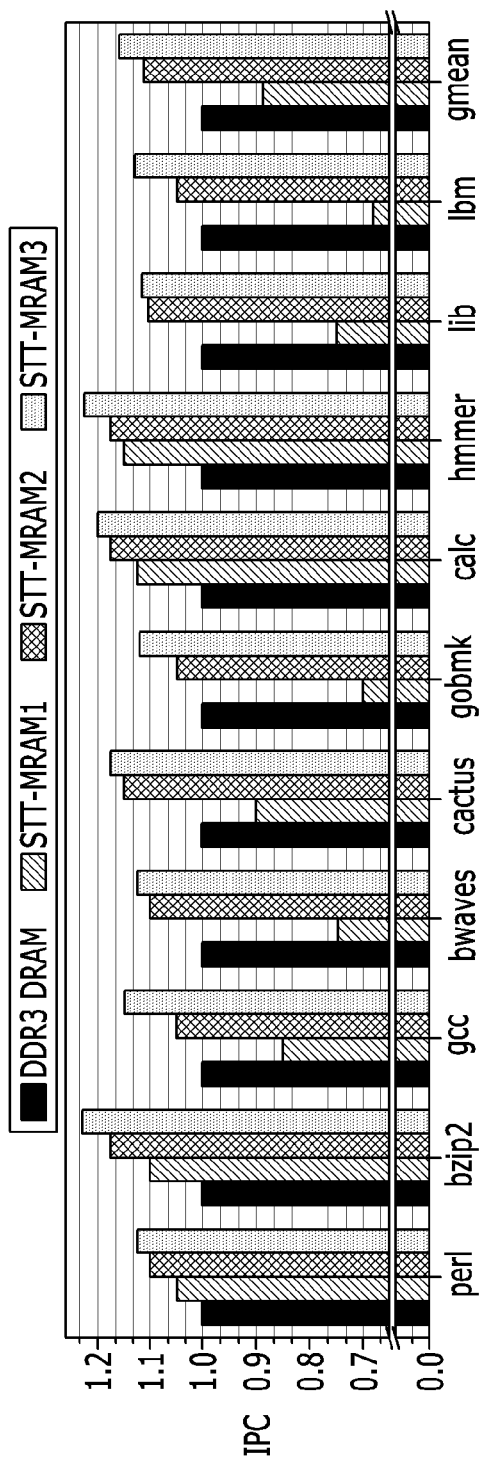
FIG. 15 is graph showing a performance comparison of four memory configurations in terms of instructions per cycle.
Figure 16:
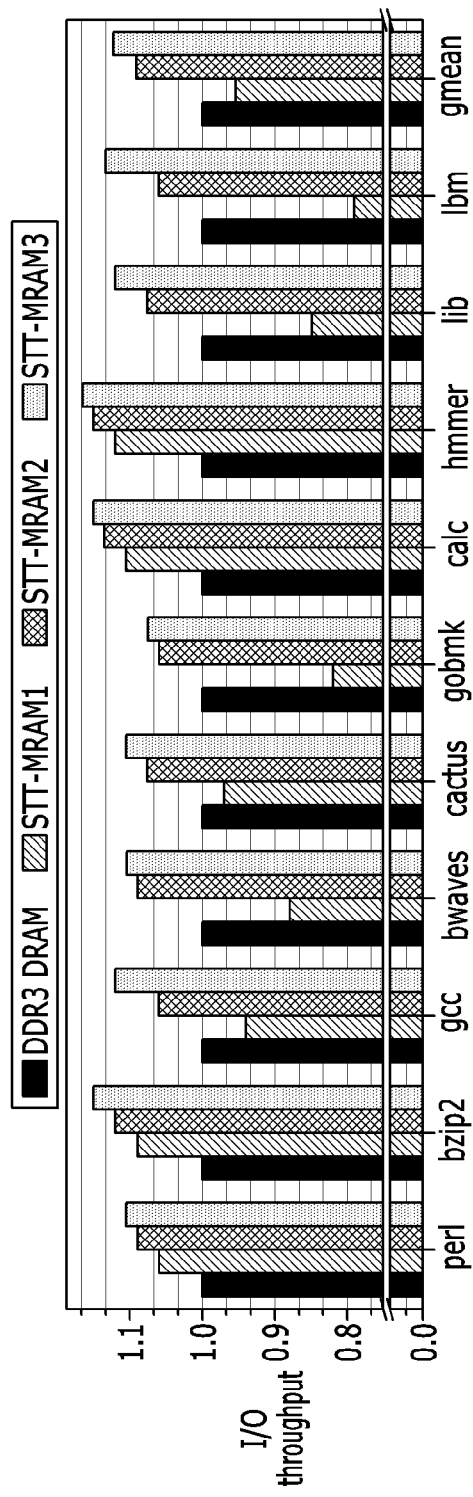
FIG. 16 is graph showing a performance comparison of four memory configurations in terms of I/O throughput.
Figure 17:
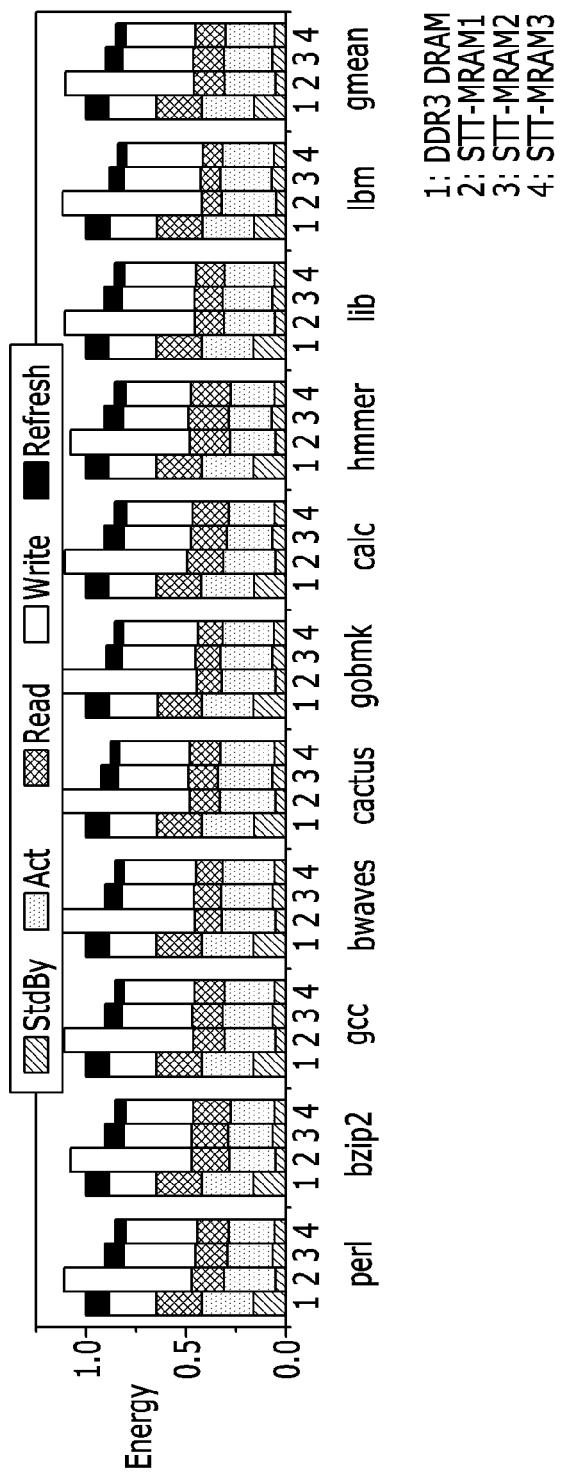
FIG. 17 is a graph showing energy consumption comparisons for five operations of four memory configurations.

FIG. 15 is graph showing a performance comparison of four memory configurations in terms of instructions per cycle (IPC), normalized to that of a DDR3 DRAM baseline, FIG. 16 is graph showing a performance comparison of four memory configurations in terms of I/O throughput (i.e., the number of read/write operations), normalized to that of a DDR3 DRAM baseline, and FIG. 17 is a graph showing energy consumption comparisons for five operations of four memory configurations. The comparison results in FIG. 15 to FIG. 17 are normalized to the DDR3 DRAM baseline.

Referring to FIG. 15, it can be noted that an STT-MRAM module (STT-MRAM2) according to an embodiment improves the average IPC by approximately 8%, compared to the DDR3 DRAM, and an STT-MRAM module (STT-MRAM3) according to another embodiment improves the average IPC by approximately 16% through a scrub scheduler, compared to the DDR3 DRAM. Referring to FIG. 16, it can be noted that the STT-MRAM module (STT-MRAM2) according to an embodiment improves the I/O throughput performance by approximately 8% on average, compared to the DDR3 DRAM, and the STT-MRAM module (STT-MRAM3) according to another embodiment improves the I/O throughput performance by approximately 13% on average, compared to the DDR3 DRAM.

Referring to FIG. 17, the energy consumption is measured for five components: standby, activation, read, write, and refresh. It can be noted that the STT-MRAM module (STT-MRAM2) according to an embodiment reduces the average energy consumption by approximately 14%, compared to the DDR3 DRAM, and the STT-MRAM module (STT-MRAM3) according to another embodiment further reduces the average energy consumption, in particular, reduces the refresh energy (i.e., the scrub energy) through the scrub scheduler, compared to the STT-MRAM module (STT-MRAM2).

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A magnetoresistive memory module comprising:
   a printed circuit board;
   a plurality of memory chips mounted on the printed circuit board; and
   a memory controller that performs data scrubbing for data stored in the plurality of memory chips,
   wherein each memory chip includes a plurality of magnetoresistive memory cells, and wherein each magnetoresistive memory cell includes a magnetoresistive element and an access transistor that transfers a current to the magnetoresistive element, and has a size of a cell area that is substantially similar to a size of a dynamic random access memory (DRAM) cell area, wherein the memory controller sets a counter to an initial value for a page whenever the page is written or scrubbed, counts down the counter with every cycle, decides whether the data scrubbing is required on the page when the counter hits zero, and schedules a scrub operation for the page when deciding that the data scrubbing is required, and wherein the memory controller decides whether the data scrubbing is required based on a learning model.

2. The magnetoresistive memory module of claim 1, wherein the magnetoresistive memory cell is a spin-transfer torque magnetoresistive random-access memory (STT-MRAM) cell that uses a magnetic tunnel junction (MTJ) element as the magnetoresistive element.

3. The magnetoresistive memory module of claim 1, wherein a size of the access transistor is 9-12 $F^2$.

4. The magnetoresistive memory module of claim 1, wherein the DRAM cell is a DRAM cell applicable to a dual in-line memory module (DIMM).

5. The magnetoresistive memory module of claim 4, wherein the cell area in the magnetoresistive memory cell has a size for allowing the memory chip including the plurality of magnetoresistive memory cells to be mounted on the DIMM, in place of a DRAM chip.

6. The magnetoresistive memory module of claim 1, wherein the magnetoresistive memory module is used as a main memory.

7. The magnetoresistive memory module of claim 1, wherein the printed circuit board further includes an error correction code (ECC) chip used for the data scrubbing.

8. The magnetoresistive memory module of claim 1, wherein the memory controller sets the counter to a value smaller than the initial value when deciding that the data scrubbing is not required.

9. The magnetoresistive memory module of claim 1, wherein the learning model includes a reinforcement-learning (RL) model, and
wherein an action of the RL model is decided as either a scrub command or a command according to an input/output request, and a state of the RL model is decided by parameters including a time elapsed since a last scrub operation and a current bit error rate (BER).

10. A computing device comprising:
the magnetoresistive memory module of claim 1;
a central processing unit (CPU) that uses the magnetoresistive memory module as a main memory; and
a system bus that connects the magnetoresistive memory module and the CPU.

11. A magnetoresistive memory module comprising:
a printed circuit board;
a plurality of memory chips mounted on the printed circuit board; and
a memory controller that performs data scrubbing for data stored in the plurality of memory chips, wherein each memory chip includes a plurality of magnetoresistive memory cells, wherein each magnetoresistive memory cell includes a magnetoresistive element and an access transistor for transferring a current to the magnetoresistive element, and has a size of a cell area that is 9-12 $F^2$, wherein the memory controller sets a counter to an initial value for a page whenever the page is written or scrubbed, counts down the counter with every cycle, decides whether the data scrubbing is required for the page when the counter hits zero, and schedules a scrub operation on the page when deciding that the data scrubbing is required, and wherein the memory controller decides whether the data scrubbing is required based on a learning model.

12. The magnetoresistive memory module of claim 11, wherein the magnetoresistive memory cell is a spin-transfer torque magnetoresistive random-access memory (STT-MRAM) cell that uses a magnetic tunnel junction (MTJ) element as the magnetoresistive element.

13. The magnetoresistive memory module of claim 11, wherein the cell area is applicable to a dual in-line memory module (DIMM).

14. The magnetoresistive memory module of claim 11, wherein the memory controller sets the counter to a value smaller than the initial value when deciding that the data scrubbing is not required.

15. The magnetoresistive memory module of claim 11, wherein the learning model includes a reinforcement-learning (RL) model, and
wherein an action of the RL model is decided as either a scrub command or a command according to an input/output request, and a state of the RL model is decided by parameters including a time elapsed since a last scrub operation and a current bit error rate (BER).

16. A computing device comprising:
the magnetoresistive memory module of claim 11;
a central processing unit (CPU) that uses the magnetoresistive memory module as a main memory; and
a system bus that connects the magnetoresistive memory module and the CPU.

* * * * *